METHOD OF PRODUCING SEMICONDUCTOR DEVICES

Filed Feb. 24, 1970 2 Sheets-Sheet 1

INVENTOR
CLIFFORD A. LEVI
BY David M. Keay
AGENT

INVENTOR
CLIFFORD A. LEVI

BY David M. Keay

AGENT

United States Patent Office 3,669,773

Patented June 13, 1972

3,669,773

METHOD OF PRODUCING SEMICONDUCTOR DEVICES

Clifford A. Levi, Billerica, Mass., assignor to Alpha Industries, Inc., Newton, Mass.

Filed Feb. 24, 1970, Ser. No. 13,710

Int. Cl. H01l 5/00

U.S. Cl. 156—17 7 Claims

ABSTRACT OF THE DISCLOSURE

In manufacturing silicon mesa diodes, the method of forming metal contacts on the upper surfaces of the mesas by applying a layer of conductive material over the entire surface of the wafer including the upper surfaces of the mesas and the silicon oxide coating on the remainder of the wafer. The wafer is positioned with the mesas downward and placed in contact with a thin layer of an uncured epoxy resin so as to cause resin to adhere only on the conductive material overlying the upper surfaces of the mesas. After curing the resin, the wafer is subjected to an etching solution to dissolve the conductive material except the contacts to the upper surfaces of the mesas which are protected by the cured epoxy resin.

BACKGROUND OF THE INVENTION

This invention relates to semiconductor electrical translating devices. More particularly, it is concerned with methods of fabricating conductive contacts on mesa diodes.

The so-called mesa structure has been widely used in certain types of semiconductor diodes. In devices of this type having a P-N junction a mesa or pedestal of semiconductor material extends above the bulk of the body of semiconductor material, and the P-N junction is disposed within the mesa generally parallel to the upper surface of the mesa. The edges of the junction at the edge surfaces of the mesa may be protected by a passivating coating as of silicon oxide. For certain applications mesa diodes have advantages over devices of the so-called planar structure in that parasitic capacitance and resistance typically are less and problems inherent in a curved junction are eliminated.

A large number of mesa devices are usually produced simultaneously from a single wafer of semiconductor material, typically silicon. For P-N junction devices the junction is formed parallel to the major surfaces of the wafer as by diffusing an appropriate conductivity type imparting material into a surface of the wafer. By employing well-known photoresist masking and etching procedures, the wafer is treated to form the mesas. A passivating layer of silicon oxide is formed on the exposed surfaces of the wafer except the upper surfaces of the mesas. An improved method for producing the mesas with the passivating silicon oxide precisely defined is disclosed and claimed in application Ser. No. 835,402, filed June 23, 1969, now abandoned and in application Ser. No. 19,085 filed Mar. 12, 1970, by Clifford A. Levi, entitled "Method of Producing Semiconductor Devices," and assigned to the assignee of the present invention.

Next, conductive contacts are applied to the upper surfaces of the mesas. Typically, metal is deposited over the exposed surfaces of the wafer as by known vacuum-deposition techniques. Conventional photoresist masking and etching procedures are employed to mask the metal on the upper surfaces of the mesas and then etch the wafer to remove the metal except from the upper surfaces of the mesas.

In order for the metal contacts to be precisely defined, the mask employed for selectively exposing the photoresist must be in precise alignment with all the mesas in the wafer. Problems also occur because of difficulty in obtaining uniform thickness of the photoresist, particularly at the peripheral edges of the upper surfaces of the mesas.

SUMMARY OF THE INVENTION

The method in accordance with the invention produces metal contacts on the upper surfaces of the mesas in a body of semiconductor material without the difficulties of the prior art photoresist technique. The body of semiconductor material has a bulk region and a plurality of mesas extending above a major surface of the bulk region. Each mesa has a flat upper surface with the upper surfaces of the plurality of mesas lying in a common plane. The surface of the bulk region and the edge surfaces of the mesas between the upper surfaces and the surface of the bulk region are covered with an adherent non-conductive coating.

The method includes the steps of depositing a layer of conductive material on the adherent non-conductive coating and on the upper surfaces of the mesas. The body is then positioned with the mesas downward and the conductive material on the upper surfaces of the mesas is immersed in a liquid masking material which adheres to the conductive material and which is capable of being cured to form a solid masking coating adherent to the conductive material. Thus, a layer of masking material adheres to the conductive material of the upper surface of each of the mesas. The layers of liquid masking material are cured to form solid masking coatings adherent to the conductive material on the upper surfaces of the mesas. Then the assembly is subjected to etching material capable of dissolving the conductive material but not the masking coatings or the non-conductive coating in order to remove the exposed conductive material not protected by the masking coatings and leave conductive material on the upper surfaces of the mesas. The masking coatings are subsequently removed from the conductive material.

BRIEF DESCRIPTION OF THE DRAWING

Additional objects, features, and advantages of the method of the invention will be apparent from the following detailed discussion and the accompanying drawings wherein:

Although several hundred devices may be fabricated simultaneously in a single wafer of semiconductor material, for purposes of illustration FIGS. 1–6 show portions of four devices being fabricated in a fragment of a wafer.

Figure 1:
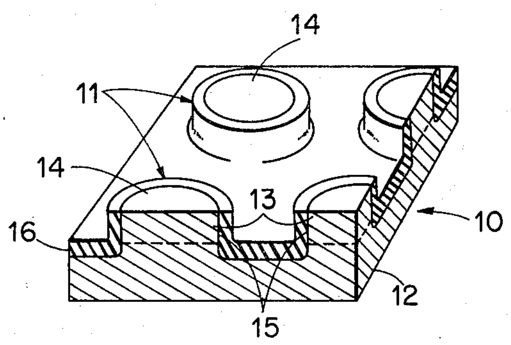
FIG. 1 is a perspective view in cross-section of a portion of a wafer of semiconductor material in which mesas have been formed.

Because of the extremely small size of various portions of the elements illustrated in the drawings, some of the dimensions have been exaggerated with respect to other dimensions. It is believed that greater clarity of presentation is thereby obtained despite consequent distortion of elements in relation to their actual physical appearance.

DETAILED DESCRIPTION OF THE INVENTION

FIG. 1 illustrates a fragment of a wafer of silicon 10 in which a plurality of mesas 11 have been produced as by employing the method disclosed and claimed in the aforementioned copending application. For illustrative purposes the wafer 10 as shown in FIG. 1 includes a bulk region 12 of one conductivity type, for example, N-type. Each mesa includes a zone of the N-type conductivity material contiguous the region and a surface layer 13 of the opposite conductivity type, P-type, forming a P-N junction with the zone. The upper surfaces 14 of the mesas lie in a common plane which is generally parallel to the upper surface of the region 12. The surface of the region 12 of the wafer and the edge surfaces 15 of each of the mesas is covered with an adherent protective coating of silicon oxide 16. The silicon at the upper surfaces 14 of the mesas is exposed.

Figure 2:
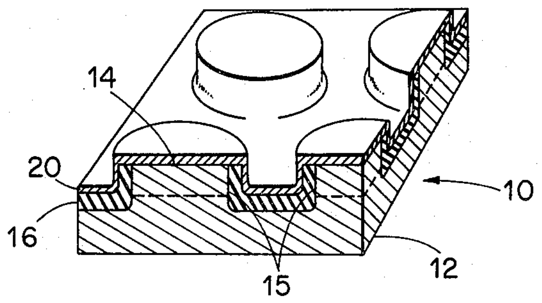
FIGS. 2–6 are perspective views in cross-section of the portion of the wafer of semiconductor material illustrating various stages in the fabrication of metal contacts to the upper surfaces of the mesas in accordance with the invention.

In accordance with the method of the invention a layer of conductive material 20 is deposited over the entire upper surface of the wafer 10 as illustrated in FIG. 2. The conductive material covers the adherent silicon oxide coating 16 on the surface of the region 12 and on the edge surfaces 15 of the mesas. The conductive material also covers the upper surfaces 14 of the mesas. The conductive material may be deposited as one or more separate films by any conventional technique, such as vacuum-deposition or sputtering.

For P-N junction devices, as illustrated in the figures, the conductive material is such as to make an ohmic contact with the silicon at the upper surfaces of the mesas. For Schottky barrier devices in which all portions of the bulk regions and the mesas are of the same conductivity type, the conductive material must be a metal which forms a barrier junction with the silicon, for example, molybdenum.

Figures 3, 4:
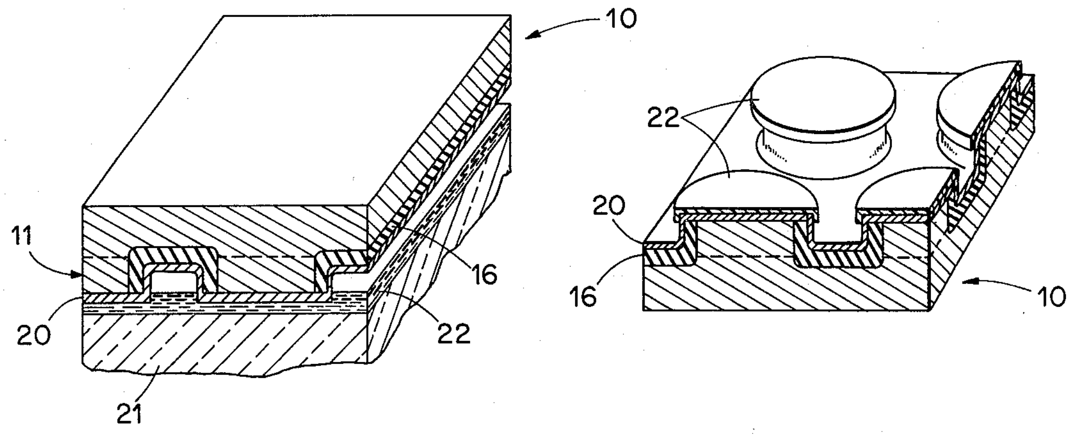

Next, as illustrated in FIG. 3 the wafer is placed with the mesas 11 downward on a plate 21 covered with a thin layer of a masking material in liquid form 22. The liquid masking material is a material which is capable of adhering to the conductive material, and is capable of being cured so as to form a solid masking layer which will also adhere to the conductive material. An epoxy resin base material including a curing agent which remains liquid at room temperature and is heated slightly, for example, between 100 and 150 °C., to obtain curing is particularly satisfactory.

The liquid masking material 22 is placed on the plate 21 at a uniform depth which is less than the height of the mesas 11. The wafer is placed on the liquid material 22 with the mesas 11 downward, and slight even pressure is applied to insure intimate contact between the liquid masking material 22 and all portions of the conductive material 20 overlying the upper surfaces of the mesas 11.

Next, the wafer 10 is separated from the plate 21. The viscosity of the liquid masking material must be such that when the wafer is withdrawn, a layer of the material will remain adherent to the conductive material on the upper surfaces of the mesas. Then, the wafer is placed in an oven and heated to a suitable temperature to cure the layer of liquid masking material to layers 22 of solid masking material as shown in FIG. 4. If the masking material is of a suitable color, it is readily apparent from observation whether or not the wafer is properly masked.

Figure 5:
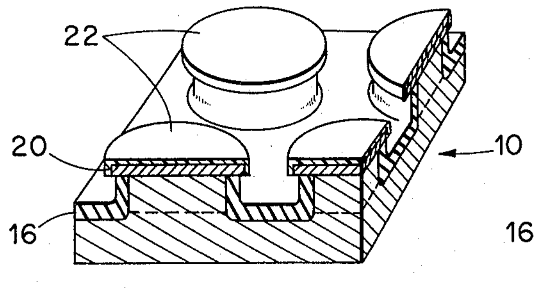

The assembly as illustrated in FIG. 4 is treated in an etching solution which is capable of dissolving the conductive material but not the solid masking material 22 or the silicon oxide 16. The assembly is immersed in the etching solution for sufficient time to remove the exposed conductive material without significantly undercutting the conductive material protected by the layers of masking material 22 as illustrated in FIG. 5. If the conductive layer includes two or more films of different materials, it may be necessary to immerse the wafer in two or more etching solutions in succession.

Figure 6:
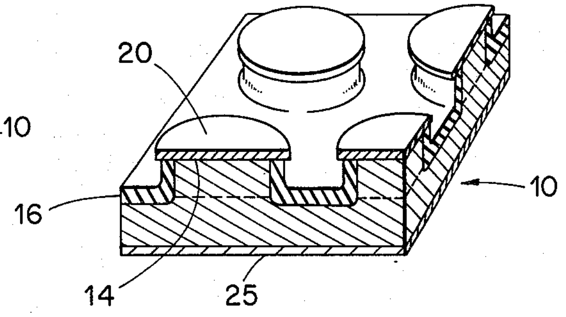

The layers of solid masking material 22 are then removed from the conductive layers 20 overlying the upper surfaces 14 of the mesas by immersing the wafer in a suitable solvent. The resulting wafer is illustrated in FIG. 6.

The undersurface of the wafer is coated with a conductive layer 25 which makes ohmic contact with the bulk region and which may be the same as the conductive material of the upper surfaces of the mesas for P-N junction devices. Then, the wafer is divided into a plurality of discrete elements, each containing a mesa, by scribing and breaking or by sawing the wafer between the mesas.

Figure 7:
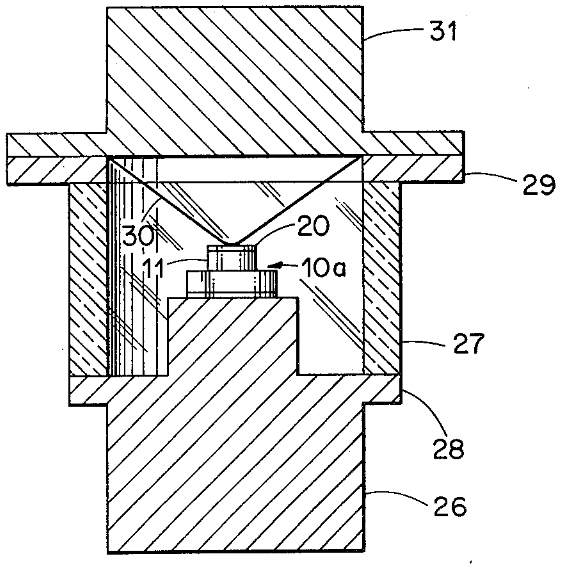
FIG. 7 is an elevational view in cross-section of a semiconductor device incorporating a semiconductor element fabricated in accordance with the method of the invention.

Each individual element, or die 10*a*, may be mounted in a suitable enclosure, for example, as illustrated in FIG. 7. The enclosure shown includes a conductive base member 26 on which the die 10*a* is mounted. A cylindrical tube 27 of insulating material is sealed to a flange 28 on the base member and also to a conductive ring member 29. The ends of a gold ribbon 30 are attached to the ring member 29 and the central portion is bonded to the metal contact 20 on the upper surface of the mesa 11. A conductive cap 31 is welded to the ring member 29 to complete the hermetically sealed semiconductor diode.

In a typical example, in the fabrication of diffused P-N junction devices, the conductive material 20 applied to the wafer was a film of chromium approximately 500 A. thick and a film of gold approximately 5000 A. thick. These metals were deposited successively by conventional vacuum-deposition techniques. The liquid masking material was an epoxy resin base pigmented ink sold under the trade name Markem ink No. 7224 F.P. by Markem Machine Co., Keene, N.H. The viscosity of the ink was between 1,000 and 2,000 centipoise.

The wafer with the liquid masking material adherent thereto was placed in a furnace and heated at a temperature of approximately 120° C. for 15 minutes in order to cure the ink to solid masking layers. After the masking layers were cured, the wafer was immersed in a conventional iodine-potassium iodide gold etching solution for sufficient time to etch through the film of gold, and then immersed in a hydrochloric acid etching solution to remove the exposed chromium. The solid masking layers were dissolved in hot sulfuric acid.

The foregoing method was employed in fabricating semi-conductor devices having mesas which varied in height from about ½ mil to about 3 mils. The epoxy base ink was placed on the plate by rolling a quantity onto the surface to a depth of approximately ½ mil.

Conductive contacts formed on the upper surfaces of the mesas by employing the method of the invention are precisely defined and cover the entire upper surfaces of the mesas. There are no problems of alignment. The conventional photoresist processing procedures of depositing photoresist, preparing a mask, aligning the mask, exposing the photoresist through the mask, and developing and hardening the photoresist are avoided. Thus, the disclosed method is more economical both as to equipment and processing time. In addition, the procedure is more amenable to automation than the photoresist procedures, which are inherently batch-process operations.

While there has been shown and described what is considered a preferred embodiment of the present invention, it will be obvious to those skilled in the art that various changes and modifications may be made therein without departing from the invention as defined by the appended claims.

What is claimed is:

1. In the method of producing semiconductor devices from a body of semiconductor material having a bulk region and a plurality of mesas extending above a major surface of the bulk region, each mesa having a flat upper surface, the upper surface, of the plurality of mesas lying in a common plane, and the surface of the bulk region and the edge surfaces of the mesas between the upper surfaces and the surface of the bulk region being covered with an adherent nonconductive coating; the steps of depositing a layer of conductive material on said adherent nonconductive coating and on the upper surface of the mesas;

positioning the body with the mesas downward and immersing the conductive material on the upper surfaces of the mesas in a liquid masking material at a depth less than the height of the mesas which liquid adheres to the conductive material and which is capable of being cured to form a solid masking coating adherent to the conductive material whereby a layer of liquid masking material adheres to the conductive material on substantially only the upper surface of each of the mesas;

curing the layers of liquid masking material to form solid masking coatings adherent to the conductive material on the upper surfaces of the mesas;

subjecting the assembly to etching material capable of dissolving the conductive material but not the masking coatings or the non-conductive coating to remove the exposed conductive material on the edge surfaces of the mesas and the surface of the bulk region while the conductive material on the upper surfaces of the mesas covered by the masking coatings remain; and removing the masking coatings.

2. The method of producing semiconductor devices in accordance with claim 1 wherein the liquid masking material is an epoxy resin base material including a curing agent.

3. The method of producing semiconductor devices in accordance with claim 1 wherein the liquid masking material is a curable epoxy resin base pigmented ink.

4. The method of producing semiconductor devices in accordance with claim 1 wherein liquid masking material is placed on a flat, planar, upper surface of a plate at a uniform depth less than the distance between the upper surfaces of the mesas and the surface of the bulk region of the body of semiconductor material;

the conductive material on the upper surfaces of the mesas is immersed in the liquid masking material by placing the body of semiconductor material in contact with the liquid masking material on the surface of the plate with the mesas downward and pressing the body toward the plate; and the body of semiconductor material is withdrawn from the plate whereby a layer of liquid masking material adheres to the conductive material on the upper surface of each of the mesas.

5. The method of producing semiconductor devices in accordance with claim 4 wherein the liquid masking material is an epoxy resin base material including a curing agent.

6. The method of producing semiconductor devices in accordance with claim 4 wherein the liquid masking material is a curable epoxy resin base pigmented ink.

7. The method of producing semiconductor devices in accordance with claim 6 wherein the body of semiconductor material is silicon; and the adherent non-conductive coating is of silicon oxide.

References Cited

UNITED STATES PATENTS

| | | | |
|---|---|---|---|
| 3,445,925 | 5/1969 | Lesk | 29—578 |
| 3,461,550 | 8/1969 | Aklufi | 29—578 |
| 2,887,367 | 5/1959 | Eisner | 156—13 |
| 3,288,662 | 11/1966 | Weisberg | 156—17 |
| 3,457,631 | 7/1969 | Hall et al. | 317—235 |

ROBERT F. BURNETT, Primary Examiner

R. J. ROCHE, Assistant Examiner

U.S. Cl. X.R.

29—578, 580; 117—212; 156—13